US006900135B2

United States Patent
Somekh et al.

(10) Patent No.: US 6,900,135 B2
(45) Date of Patent: May 31, 2005

(54) BUFFER STATION FOR WAFER BACKSIDE CLEANING AND INSPECTION

(75) Inventors: Sasson R. Somekh, Los Altos Hills, CA (US); Yoram Uziel, Misgav (IL); Raphy Adout, Misgav (IL)

(73) Assignee: Applied Materials, Inc., Santa Clara, CA (US)

( * ) Notice: Subject to any disclaimer, the term of this patent is extended or adjusted under 35 U.S.C. 154(b) by 43 days.

(21) Appl. No.: 10/330,810

(22) Filed: Dec. 27, 2002

(65) Prior Publication Data
US 2004/0042877 A1 Mar. 4, 2004

Related U.S. Application Data
(60) Provisional application No. 60/406,566, filed on Aug. 27, 2002.

(51) Int. Cl.[7] .................. H01L 21/302; H01L 21/461
(52) U.S. Cl. .................. 438/704; 438/14; 118/50.1; 118/75; 356/237.3
(58) Field of Search ................ 438/704, 14, 906; 118/50.1, 71, 75, 712, 500; 324/71.5; 356/237.3, 294, 218, 237.8

(56) References Cited

U.S. PATENT DOCUMENTS

| | | | | |
|---|---|---|---|---|
| 5,930,586 A | * | 7/1999 | Jain et al. | 438/14 |
| 5,963,315 A | * | 10/1999 | Hiatt et al. | 356/237.3 |
| 6,747,464 B1 | * | 6/2004 | Blackwood | 324/752 |
| 2002/0074512 A1 | * | 6/2002 | Montagu et al. | 250/458.1 |

OTHER PUBLICATIONS

"Programmable z stage" IBM Technical Disclosure Bulletin, NA81123436, vol. 24, No. 7A(Dec. 1981)p. 3436.*
"Event–Discriminating Algorithm–Automatic Defect/Particulate Detection System" IBM Technical Disclosure Bulletin,NN85057143, vol. 27, No. 12 (May 1985) pp–7143–7148).*

* cited by examiner

Primary Examiner—Caridad Everhart
(74) Attorney, Agent, or Firm—Blakely, Sokoloff, Taylor & Zafman

(57) ABSTRACT

A wafer processing station includes an air gap chuck and a light emitter/collector assembly configured to gather light when scattered or reflected by contaminants on the wafer. The light emitter/collector assembly is driven by an actuator so that it passes across a backside surface of a wafer when supported within the chuck during wafer inspection. The wafer processing station may also include a cleaning module configured to clean the backside surface of the wafer when contaminants are discovered during wafer inspection. A computer system may be coupled to receive one or more signals from the light emitter/collector assembly that are indicative of contaminants on the backside surface of the wafer and to provide one or more control signals to the cleaning module in accordance therewith. The cleaning module may be used independently of the light emitter/collector assembly and vice-versa.

25 Claims, 3 Drawing Sheets

BUFFER STATION FOR WAFER BACKSIDE CLEANING AND INSPECTION

RELATED APPLICATION

This application is related to and hereby claims the priority benefit of U.S. Provisional Patent Application No. 60/406,566, entitled "Buffer Station for Wafer Backside Clean and Inspection", filed Aug. 27, 2002 by the present inventor.

FIELD OF THE INVENTION

The present invention relates to semiconductor wafer cleaning and inspection during wafer processing and, in particular, to a method and apparatus for cleaning and inspecting the backside of a wafer during such processing.

BACKGROUND

Semiconductor wafer backside contamination is created during many different semiconductor integrated circuit manufacturing steps. In many cases, coming into contact with the wafer handling/processing equipment contaminates the wafer backside. For example, robotic components such as end effectors, wafer chucks, and wafer cassettes and other wafer storage devices cause different kinds of particles to be firmly attached to the backside of a wafer. This may occur during a variety of wafer exchange procedures and is associated with the friction, high vacuum contact forces and electrostatic charge buildup and discharge cycles that occur during such transfers.

Other types of contamination on a wafer backside may result from various chemical processes to which the wafer is subjected during processing. Although these processes are primarily intended to affect the top surface of the wafer, inevitably some effect on the wafer backside may result as well. For example, residues of photo resist polymer may adhere to the wafer backside during lithographic procedures (e.g., coating, baking and stripping). Metal contamination of the backside may also occur during various types of dry or wet processes.

Contamination of the wafer backside leads to overall yield degradation as the backside contamination may ultimately reach the wafer's top surface, harming sensitive devices. In addition, backside contamination that affects a wafer's planarity may cause problems with photolithographic procedures. For example, large particles adhering to the backside may act like bumps and when ultra flat chucks are used to support the wafer during photolithographic procedures, these bumps may cause the top side of the wafer to be positioned out of focus for the lithographic procedure, again resulting in lower overall component yield.

Others have recognized the problems that result from wafer backside contamination during wafer processing and have proposed schemes for cleaning these backside surfaces. For example, some have advocated post-CMP cleaning of the backside by brush scrubber cleaning, megasonic cleaning or even wet etching. Wet etching has also been proposed for removing films from wafer backsides. However, to date none of these techniques have been combined with methods for wafer backside inspection so as to know whether or not the cleaning has been successful.

Where wafer backside inspection has been employed it is generally seen as a time consuming task, requiring the use of dedicated machinery to grasp the wafer by its edge and rotate it so that conventional topside inspection tools can be used to examine the backside. That is, the backside inspection involves physically contacting the wafer so as to invert it to such a position that metrology tools otherwise used for inspecting the top surface of a wafer may now be used to inspect the backside thereof. Such a solution is less than optimum for several reasons, including the fact that physically manipulating the wafer in this fashion may itself cause damage, leading to still further yield reductions.

Thus, what is needed is a new method and apparatus for wafer backside cleaning and inspection.

SUMMARY OF THE INVENTION

In one embodiment, a wafer processing station that includes an air gap chuck and a light emitter/collector assembly configured to gather light when scattered or reflected by contaminants on the wafer is provided. The light emitter/collector assembly is driven by an actuator so that it passes across a backside surface of a wafer when supported within the chuck during wafer inspection. The wafer processing station may also include a cleaning module configured to clean the backside surface of the wafer when contaminants are discovered during wafer inspection. A computer system may be coupled to receive one or more signals from the light emitter/collector assembly that are indicative of contaminants on the backside surface of the wafer and to provide one or more control signals to the cleaning module in accordance therewith. The cleaning module may be used independently of the light emitter/collector assembly and vice-versa In a further embodiment, inspecting and cleaning a backside of a wafer supported within a chuck at a wafer processing station are provided, the inspecting being performed using light scattered and/or reflected from contaminants of a backside of the wafer as it is supported (e.g., on an air gap) within the chuck. In some cases, the cleaning and the inspecting are performed concurrently, while in other cases a cascaded inspection and cleaning approach are used. The inspecting may performed by rotating the wafer about an axis thereof above a light emitter/collector arrangement. The light emitter/collector arrangement is driven in a radial direction with respect to the wafer through a slot in the chuck and the cleaning is performed according to signals provided by the light emitter/collector arrangement.

In yet another embodiment, the backside of a wafer supported within a chuck at a wafer processing station is cleaned according to control signals provided by a system that includes an optical assembly configured to inspect wafer contamination through light waves scattered or reflected from contaminants of the backside of the wafer. The cleaning may be performed using a liquid or air shear forces. During the inspection, the wafer is rotated above the optical assembly, which is driven radially with respect to the wafer.

BRIEF DESCRIPTION OF THE DRAWINGS

The present invention is illustrated by way of example, and not limitation, in the figures of the accompanying drawings in which.

DETAILED DESCRIPTION

Described herein is a method and apparatus for semiconductor wafer cleaning and inspection during wafer processing (e.g., photolithographic processing) and, in particular, to a method and apparatus for cleaning and inspecting the backside of a wafer during such processing. Although the present invention will be discussed with reference to certain illustrated embodiments thereof the use of such examples should not be read as limiting the broader scope of the invention. Instead, these examples are being used to more effectively convey information regarding the invention to the reader than would otherwise be possible if no such examples were used.

Some portions of the detailed description that follows are presented in terms of operations on signals provided to a computer system. In general, such computer systems will be programmed to carry out the operations described herein, and in some cases special purpose (as opposed to general purpose) computer systems may be used for such tasks. The algorithms used for such programming are, generally, conceived to be a self-consistent sequence of steps leading to a desired result. The steps are those requiring physical manipulations of physical quantities, represented by the input and output signals discussed below. Further, unless specifically stated otherwise, it should be appreciated that throughout the description of the present invention, use of terms such as "computing", "calculating", "determining", "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 1:
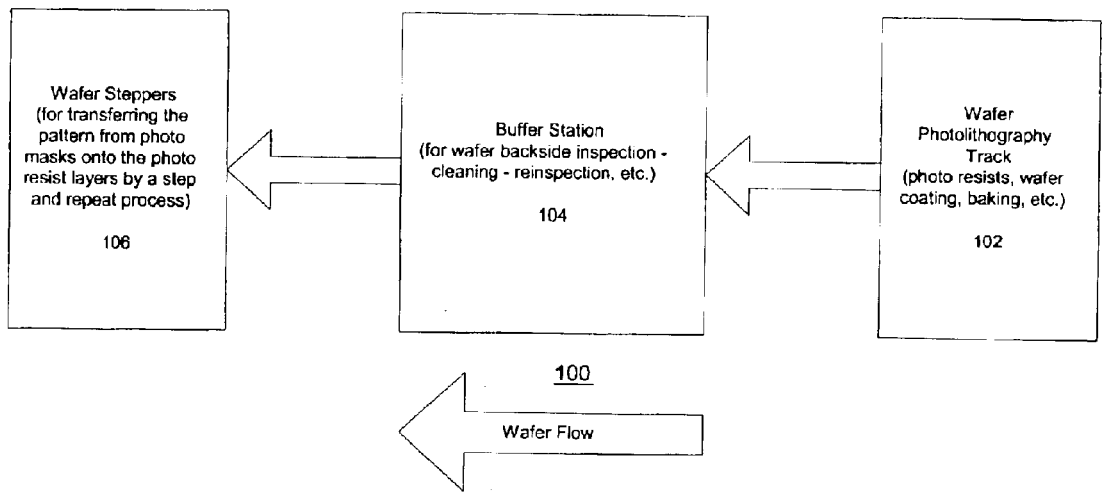
FIG. 1 illustrates a portion of a wafer processing operation that includes backside inspection and cleaning at a buffer station in accordance with an embodiment of the present invention.

As illustrated in FIG. 1, the present invention provides a buffer station or module at various wafer transfer points in a wafer processing operation 100, for example in the photolithographic process track. The backsides of wafers entering the buffer station are inspected, cleaned and re-inspected to ensure that backside contamination is minimized (if not eliminated) before the wafer is allowed to proceed to the next wafer processing station in the track. In one specific embodiment, the buffer station is provided to inspect and clean wafer backsides before the wafers undergo photolithographic processing involving steppers.

The example illustrated in FIG. 1 shows a portion of a wafer processing operation 100. Wafers undergo processing in a photolithography track 102, for example having photo resist applied and baked prior to undergoing lithographic exposure. Because such exposure operations are very sensitive to any backside wafer contamination (for example particle contamination which may cause the wafer to not lie truly flat within an ultra flat chuck during the procedure), this is an ideal location for the buffer station 104 at which backside inspection and cleaning may be carried out. Once the inspection and cleaning has been completed, the wafers may continue in the photolithographic track by being transferred to the steppers 106 for the lithographic exposure procedures.

While the point between photo resist applications and lithographic exposure presents one location at which the present buffer station 104 may be deployed within a wafer processing operation, buffer stations 104 may be deployed at any point within such operations where backside contamination may be suspected or where such contamination needs to be avoided. As discussed below, the present buffer stations provide for wafer backside cleaning according to the amount of contamination revealed by an inspection. The inspection is carried out so that the process does not subject the wafer to any tilting or other manipulation that might itself cause damage to or further contamination of the wafer.

During such cleaning, large particles (e.g., those larger than 0.5 microns) on the wafer backsides may be removed by air shear forces created using an airflow, as described in co-pending U.S. Provisional Patent Application No. 60/347,726, entitled "Microchamber Able to Apply Cleaning and Processes Within a Limited Area/Volume", filed Jan. 11, 2002, assigned to the assignee of the present invention and incorporated herein by reference. Other wafer cleaning processes may also be used at the buffer station 104.

Figure 2:
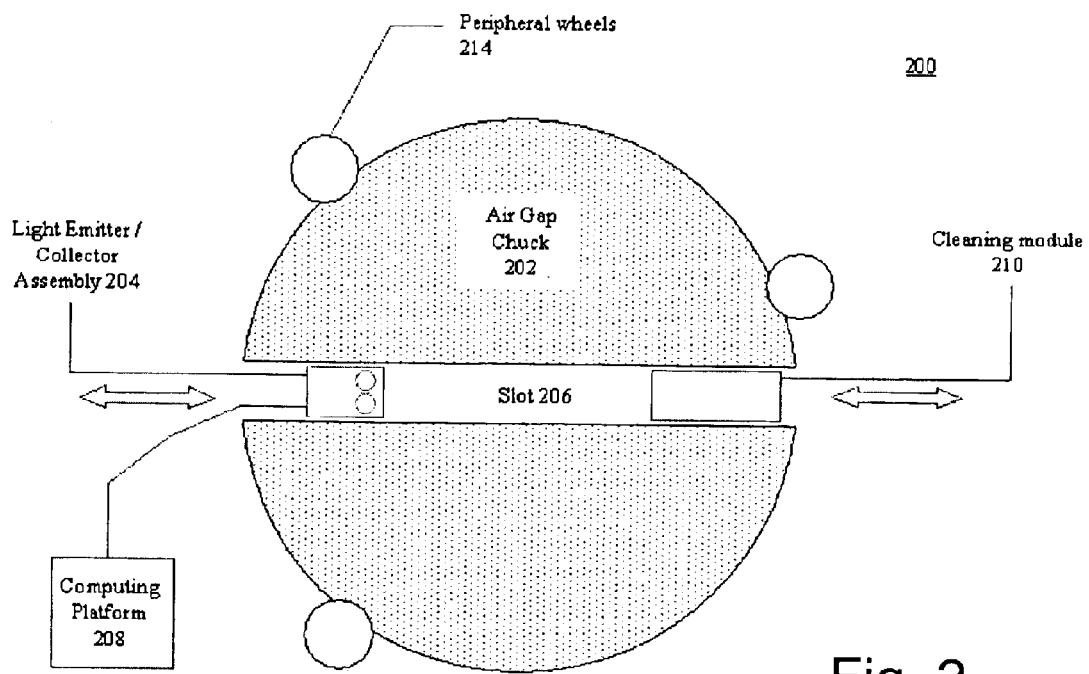
FIG. 2 is a top view of an embodiment of a wafer backside inspection and cleaning station configured in accordance with an embodiment of the present invention.

Referring now to FIG. 2, an example of a buffer station 200 is shown. In particular, a top view of the buffer station 200 is illustrated (without the wafer itself being shown). Unlike backside inspection schemes of the past, the present invention provides for in-situ inspection of the wafer backside. As the wafer is supported by and rotated within an air gap chuck 202 at the buffer station 200, a light emitter/collector apparatus 204 is moved radially within a slot 206 in the chuck so as to pass beneath the wafer backside. Light emitted by the emitter/collector apparatus 204 (e.g., using one or more light emitting diodes or laser diodes) is scattered and/or reflected by particles or other contaminants adhering to and/or embedded within the wafer backside and the scattered/reflected light is collected by a collector (e.g., one or more photo diodes) included within the apparatus 204.

The amount of light so collected by the photo diodes or other collectors is indicative of the degree of contamination of the wafer backside and an electrical signal proportional to the amount (e.g., the intensity) of the collected light is provided from the emitter/collector apparatus 204 to a computer system 208. Using this signal, the computer system 208 may determine the amount of contamination remaining on the wafer backside. For example, the computer system 208 may compare the signal strength of the received signal from the emitter/collector apparatus 204 to a predetermined threshold or a table of values to determine whether or not the contamination has been reduced to an acceptable level. The computer system 208 may instruct (e.g., using one or more control signals) a cleaning module 210 (e.g., such as the cleaning processing micro-chamber described in the above-referenced co-pending patent application) to continue cleaning the wafer backside (using one or more cleaning techniques such as chemical or water rinsing and/or air shear cleaning) until the returned signal from the emitter/collector apparatus 208 indicates that the wafer backside contamination has been reduced to acceptable levels (or eliminated altogether).

Figure 3:
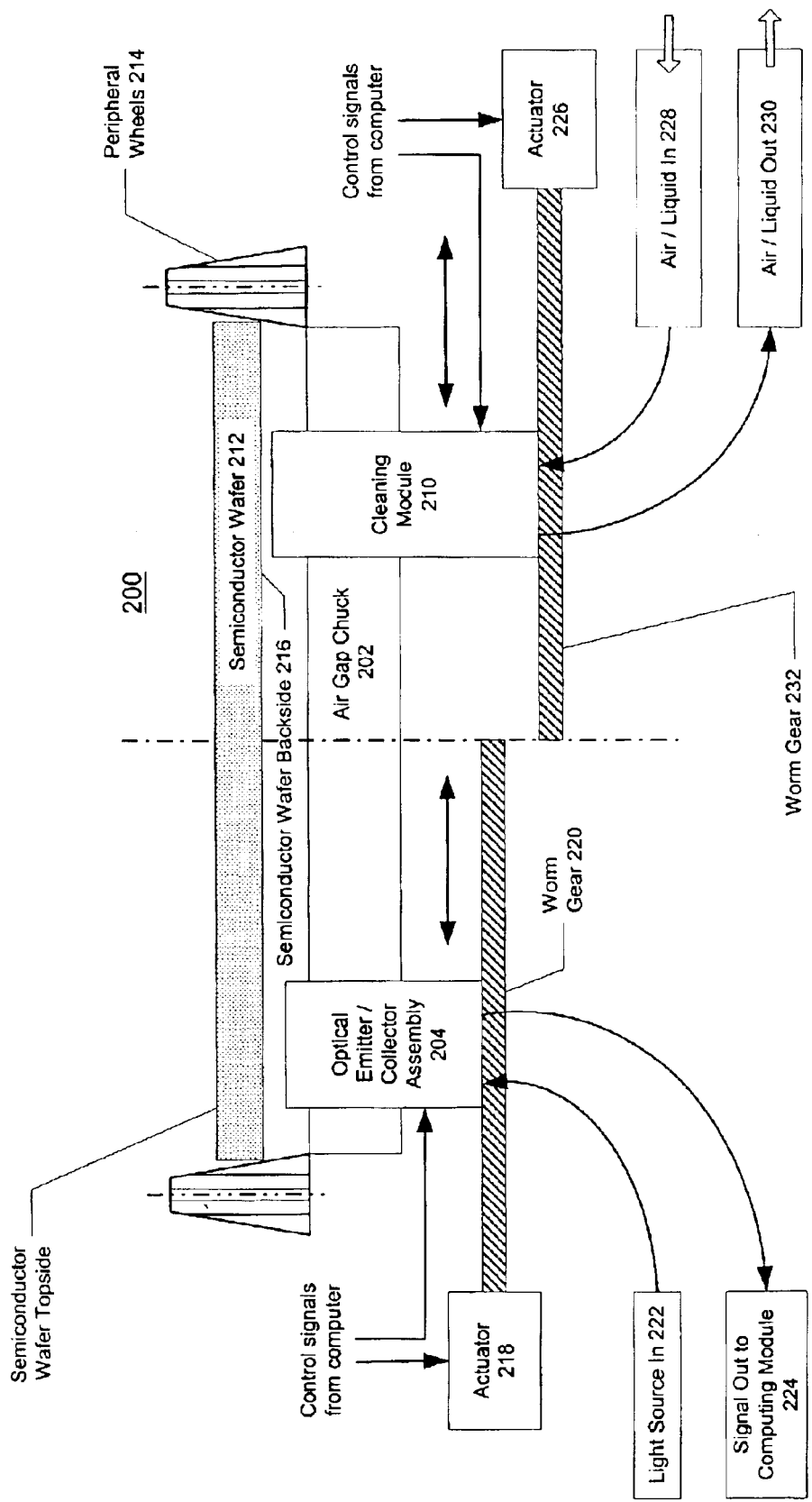
FIG. 3 is a cut away side view of the wafer backside inspection and cleaning station shown in FIG. 2.

FIG. 3 is a side view (through the center of the chuck 202) of the buffer station 200. Within the chuck 202, the wafer 212 (illustrated here but not shown in FIG. 2) is supported on an air cushion and rotated about its central axis by peripheral wheels 214. As the wafer 212 rotates, the backside 216 of the wafer 212 passes over the slot 206 in which the light emitter/collector apparatus 204 moves in and out (i.e., in a radial direction with respect to wafer 212). The motion of light emitter/collector apparatus 204 is controlled by an actuator 218, which may be used to drive a worm gear 220 (or other drive train assembly) on which the light emitter/collector apparatus 204 is mounted or attached. Thus, the light emitter/collector apparatus 204 will pass under the wafer 212 and light provided by a light source 222 (which may be internal or external to the light emitter/collector apparatus 204 and under the control of the computer system 208) is emitted so as to scatter (or reflect) off the wafer backside 216. The scattered (or reflected) light is gathered by the light emitter/collector apparatus 204 and may be converted to an electrical signal (e.g., by one or more photo diodes) 224 which is provided to the computer system 208.

The computer system 208 uses the signal 224 to determine whether or not to clean (or continue cleaning) the wafer backside 216. In the illustrated example, a cleaning module 210 is sued to perform the cleaning. Like the optical emitter/collector assembly 204, the cleaning module 210 moves radially (with respect to the wafer 212) within the slot 206 of the chuck 202. This movement may be controlled by an actuator 226, itself under the control of computer system 208. That is, when the computer system 208 determines that cleaning of the wafer backside is necessary, the computer system 208 may instruct (via one or more control signals) the actuator 226 to drive the cleaning module 210 within the slot 206, which the chamber 210 performs the desired form(s) of cleaning.

Cleaning module 210 may be a cleaning processing micro-chamber configured to provide liquid (e.g., chemical) and/or air shear force cleaning of the wafer backside 216 and air/liquid in and out paths 228 and 230, respectively, are provided for delivering the cleaning fluids or air. Where air shear force cleaning is used, the high-pressure gas injected into the region around the micro-chamber creates an aerodynamic shearing force at the wafer backside surface, which is helpful in dislodging contaminants from the surface. Within the micro-chamber, various means (as explained in detail in the above-cited copending patent application) may be used for cleaning the backside surface 216, including (but not limited to) laser irradiation, particle bombardment, plasma generation, liquid and gaseous agents, and other means known in the art. The cleaning module 210 may be attached to or mounted on a worm gear 232 or other drive train assembly attached to the actuator 226 so as to be moveable within the slot 206 under the wafer 212.

Rather than encompassing the entire wafer, in the manner of processing chambers known in the art, the cleaning module 210 covers and processes only a small area of the surface of the wafer backside 216 at any one time. In one embodiment, an air bearing seal is created between the periphery of the cleaning module 210 and the backside surface. This seal permits the cleaning module 210 to be scanned over the wafer backside 216 without damaging the backside surface, while maintaining controlled atmospheric conditions—either vacuum or positive pressure—within the region being cleaned. By scanning the cleaning module 210 over the backside surface, e.g., using the actuator 226 and worm gear 232 as a linear mechanical scanner arrangement, the entire wafer backside 216 can be processed.

In some cases, the inspection and cleaning process is performed by first inspecting the wafer backside 216 for contamination and, if any is detected, by then cleaning the wafer backside 216 according to a predetermined cleaning routine. For example a liquid and/or air shear cleaning may be performed for a specified time interval, after which time the wafer backside 216 may be re-inspected to determine whether or not the contamination has been sufficiently removed. This process may be repeated (potentially employing different cleaning techniques to remove different types of contaminants as revealed by the inspection) until the contamination has been reduced to a satisfactory level (or even eliminated altogether) and the wafer 212 may then be passed on to the next processing station.

In other embodiments, the cleaning and the inspection may occur at the same time. That is, air shear (or perhaps even liquid-based) cleaning may occur while the backside of the wafer is being inspected. This may reduce the overall time required to perform the cleaning and inspection operation. In such an embodiment, the computer system 208 may be programmed to provide real time instructions to the cleaning module 210 and its actuator 226, based on the signals being provided by the optical emitter/collector apparatus 204 as it moves underneath the rotating wafer 212. Where wet cleaning processes are used, care needs to be taken to ensure that the liquid does not contaminate the optical emitter/collector apparatus 204.

The embodiment illustrated in FIG. 3 shows separate actuators, 218 and 226, and drive trains, 220 and 232, for the optical emitter/collector apparatus 204 and the cleaning module 210. However, in other embodiments a single actuator with multiple drive trains, or even just a single drive train, may be used. In cases where a single actuator and multiple drive trains are used, the optical emitter/collector apparatus 204 and cleaning module 210 may operate side by side within the slot 206 in chuck 202. Indeed, this may also be true where separate drive trains and actuators are used. Alternatively, in some drive train/actuator configurations, the inspection and cleaning apparatus may operate on opposite sides of the chuck axis center, in a fashion similar to that shown in the illustration. Where a single drive train is used for both assemblies, the drive train should be long enough to permit both the cleaning module 210 and the light emitter/collector assembly 204 to pass under the complete wafer backside 216 (which may be accomplished if each device can travel from an outside edge of the wafer to its center along a radial path). Of course, where a single drive train is used it may be desirable to incorporate the components of both the cleaning processing micro-chamber 210 and the light emitter/collector assembly 204 within a single housing.

Figure 4:
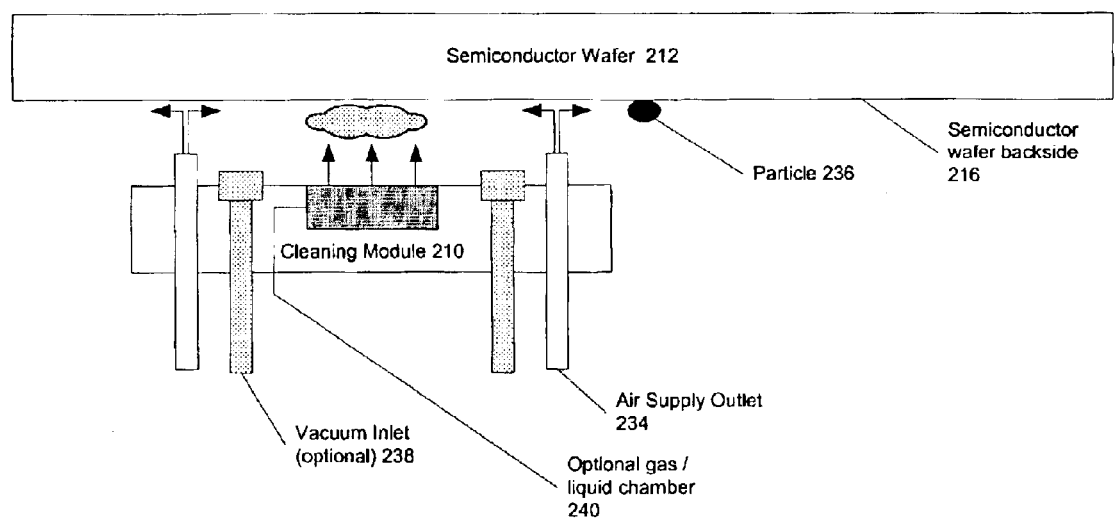
FIG. 4 illustrates an example of a cleaning module configured in accordance with an embodiment of the present invention.

FIG. 4 illustrates an example of cleaning module 210. Air supply outlets 234 are connected to a source of (relatively) high-pressure air (e.g., 4–70 atm) and are directed towards the backside 216 of the wafer 212 so as to create shear forces sufficient to dislodge contaminants such as particle 236. Optional vacuum inlets 238 are included so that an optional gas/liquid chamber 240 may be used to provide reactive gas, steam or liquid to assist in the cleaning process. The vacuum inlets 238 will ensure that the cleaning material is removed from the area. In some cases, a circumferential vacuum groove may be used instead of separate inlets.

Thus, a method and apparatus for semiconductor wafer cleaning and inspection during wafer processing has been described. Alternative arrangements for various components of the cleaning and inspections station are possible. For example, the light emitter/collector assembly and/or the cleaning apparatus may be integrated into the air gap chuck, thus eliminating the need for a slotted chuck. Further, the cleaning module may be used independently of the light emitter/collector assembly and vice-versa. In such cases, the cleaning module or the light emitter/collector apparatus (as applicable) may pass under the entire backside surface of the wafer during cleaning/inspection. Therefore, remembering that the examples presented above were not intended to limit the broader scope of the present invention, one should now refer to the following claims for a better understanding of that scope.

What is claimed is:

1. A wafer processing station, comprising:
   a chuck configured to support a wafer on an air gap;
   an assembly having an emitter configured to transmit light and a collector configured to gather the light when scattered or reflected by contaminants on the wafer; and
   an actuator coupled to drive the assembly so that the emitter and the collector pass across a backside surface of the wafer when supported within the chuck during wafer inspection.

2. The wafer processing station of claim 1 wherein the chuck has a slot therein, through which the assembly passes during wafer inspection.

3. The wafer processing station of claim 2 wherein the actuator is coupled to the assembly via a worm gear drive train.

4. The wafer processing station of claim 2 wherein the emitter comprises a light emitting diode.

5. The wafer processing station of claim 4 wherein the collector comprises a photo diode.

6. The wafer processing station of claim 1 further comprising a cleaning module configured to clean the backside surface of the wafer when contaminants are discovered during wafer inspection.

7. The wafer processing station of claim 6 further comprising a computer system coupled to receive one or more signals from the assembly that are indicative of contaminants on the backside surface of the wafer and to provide one or more control signals to the cleaning module in accordance therewith.

8. The wafer processing station of claim 7 wherein the actuator is further coupled to drive the cleaning module across a backside surface of the wafer.

9. The wafer processing station of claim 7 further comprising a second actuator coupled to drive the cleaning module across the backside surface of the wafer.

10. The wafer processing station of claim 2 further comprising a cleaning module configured to operate within the slot so as to clean the backside surface of the wafer.

11. The wafer processing station of claim 10 wherein the cleaning module and the assembly are coupled to a computer system programmed to provide control signals to direct operation of the cleaning module according to signals received from the assembly that are indicative of contaminants on the backside of the wafer.

12. The wafer processing station of claim 2 further comprising a cleaning module integrated within the chuck.

13. A method, comprising inspecting and cleaning a backside of a wafer supported within a chuck at a wafer processing station, the inspecting being performed using light scattered and/or reflected from contaminants of a backside of the wafer as it is supported on an air gap within the chuck.

14. The method of claim 13 wherein the cleaning and the inspecting are performed concurrently.

15. The method of claim 13 wherein the inspecting is performed by rotating the wafer about an axis thereof above a light emitter/collector arrangement.

16. The method of claim 15 wherein during the inspecting the light emitter/collector arrangement is driven in a radial direction with respect to the wafer through a slot in the chuck.

17. The method of claim 16 wherein the cleaning is performed according to signals provided by the light emitter/collector arrangement.

18. A method, comprising cleaning a backside of a wafer supported within a chuck on an air gap at a wafer processing station according to control signals provided by a control system that includes an optical assembly configured to inspect wafer contamination through light waves scattered or reflected from contaminants of a backside of the wafer.

19. The method of claim 18, wherein the cleaning is performed using one or more of a liquid or air shear forces.

20. The method of claim 19, wherein the wafer is rotated above the optical assembly during inspection for wafer contamination.

21. The method of claim 20, wherein the optical assembly is driven radially with respect to the wafer as the wafer rotates above the optical assembly during wafer inspection.

22. A wafer processing station, comprising:
    a chuck configured to support a wafer on an air gap; and
    a cleaning module configured to clean a backside surface of the wafer as the wafer is supported within the chuck.

23. The wafer processing station of claim 22 wherein the chuck has a slot therein, through which the cleaning module passes during wafer backside cleaning.

24. The wafer processing station of claim 22 wherein the cleaning module is integrated within the chuck.

25. The wafer processing station of claim 22 further comprising an assembly having an emitter configured to transmit light towards a backside of the wafer when supported within the chuck and a collector configured to gather the light when scattered or reflected by contaminants on the backside of the wafer.

* * * * *